(12) United States Patent
Chen

(10) Patent No.: US 8,748,513 B2
(45) Date of Patent: Jun. 10, 2014

(54) EPOXY RESIN COMPOSITION, AND PREPREG AND PRINTED CIRCUIT BOARD USING THE SAME

(75) Inventor: Hsien-Te Chen, Jhubei (TW)

(73) Assignee: Taiwan Union Technology Corporation, Jhubei, Hsinchu County (TW)

( * ) Notice: Subject to any disclaimer, the term of this patent is extended or adjusted under 35 U.S.C. 154(b) by 345 days.

(21) Appl. No.: 12/836,871

(22) Filed: Jul. 15, 2010

(65) Prior Publication Data

US 2011/0253433 A1 Oct. 20, 2011

(30) Foreign Application Priority Data

Apr. 20, 2010 (TW) ................................ 99112372 A

(51) Int. Cl.
*B32B 15/092* (2006.01)
*B32B 27/04* (2006.01)
*C08K 3/10* (2006.01)
*C08K 3/22* (2006.01)
*C08L 63/02* (2006.01)
*H05K 1/03* (2006.01)

(52) U.S. Cl.
USPC ........... 523/457; 174/255; 428/413; 428/416; 523/466; 525/510

(58) Field of Classification Search
None
See application file for complete search history.

(56) References Cited

U.S. PATENT DOCUMENTS

| 6,558,797 B1 | 5/2003 | Arata et al. | |
|---|---|---|---|
| 6,605,354 B1 * | 8/2003 | Gerber | 428/413 |
| 2003/0044588 A1 * | 3/2003 | Komoto et al. | 428/209 |

FOREIGN PATENT DOCUMENTS

| CN | 1861682 A | | 11/2006 |
|---|---|---|---|
| CN | 101381506 A | | 3/2009 |
| CN | 101746102 A | * | 6/2010 |
| TW | 293831 | | 12/1996 |
| TW | 583258 | | 4/2004 |
| WO | WO2006/004118 | | 1/2006 |

OTHER PUBLICATIONS

Hexion Technical Data Bulletin for EPON Resin 828, Sep. 2005, 8 pages.*
Chemical abstracts registry No. 440360-19-0 for melamine-modified phenolic novolak PS 6313, 2006, one page.*
Wang et al., "Synthesis, characterization, and cure properties of phosphorous-containing epoxy resins for flame retardance," European Polymer Journal, 40, 2004, pp. 385-395.

* cited by examiner

*Primary Examiner* — Robert Sellers
(74) *Attorney, Agent, or Firm* — Muncy, Geissler, Olds & Lowe, P.C.

(57) ABSTRACT

Disclosed is an epoxy resin composition for printed circuit board, which includes (A) an epoxy resin; (B) a composite curing agent, including amino-triazine-novolac resin and diaminodiphenylsulfone mixed in a certain proportion; (C) a curing accelerator; and (D) an optional inorganic filler.

14 Claims, No Drawings

EPOXY RESIN COMPOSITION, AND PREPREG AND PRINTED CIRCUIT BOARD USING THE SAME

BACKGROUND OF THE INVENTION

1. Field of the Invention

The present invention relates to an epoxy resin composition, and a prepreg and a printed wiring board using the epoxy resin composition, and more particularly to an epoxy resin composition including a composite curing agent, and a prepreg impregnated with such a composition and a printed circuit board (PCB) manufactured by using such a prepreg.

2. The Prior Arts

The demand for downsizing the printed circuit boards on which electronic components are mounted is increasingly rising. Accordingly, it is required that the wire width is reduced, the diameter of the through-hole is reduced, and the plating thickness is reduced. However, the reduction of plating thickness can cause the plating to crack or blister when a heat shock is applied to the plating. Thus, the printed circuit boards are required to be highly heat-resistant. In addition, the printed circuit board desirably has a low dielectric constant and a low dissipation so as to be advantageous in increasing the signal transmission speed.

The printed wiring boards are typically manufactured by using the prepregs. For manufacturing a prepreg, in general, a substrate was impregnated with a varnish prepared by dissolving a thermosetting resin, such as epoxy resin, in a solvent, followed by partial curing of the resin, and such impregnated substrate is commonly referred to as prepreg. For manufacturing a printed wiring board, in general, it involves laminating a particular number of layers of the prepregs, and placing a metal foil additionally on at least one outermost layer, and forming a particular circuit pattern on the surface of the metal-clad laminate by etching the metal foil thereon.

The printed circuit board must meet the criteria for heat resistance, dielectric properties, and chemical resistance, and it is worthy of note that the thermosetting resin plays a key role in improving the properties of the printed circuit board. The thermosetting resin can be cross-linked with a multi-functional amine to form an interpenetrating polymeric network (IPN). Although IPNs have favorable properties such as high glass transition temperature and high chemical resistance, they have the drawback of being too brittle to be processed as prepregs. For instance, it proves impossible to cut up such prepregs without a portion of the resin blowing about in the form of a large quantity of dry dust.

TW patent No. 293831 and WO2006004118A1 disclose an epoxy resin composition including an amino-triazine-novolac (ATN) resin used as curing agent for epoxy resin. The amino-triazine-novolac resin can be represented by the general formula given below:

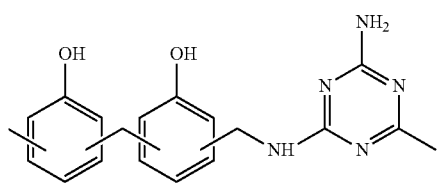

The amino-triazine-novolac resin was prepared by reacting a phenolic compound, an aldehyde compound and a guanamine compound in the presence of an acid catalyst such as oxalic acid or p-toluene sulfonic acid. The phenolic compound used includes, for example, phenol, resorcin, and alkyl phenols such as cresol and xylenol. The aldehyde compound used includes, for example, formaldehyde. The guanamine compound can be represented by the general formula given below:

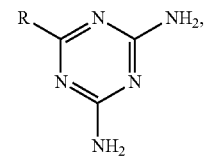

where R is amino, phenyl, or alkyl such as methyl.

The guanamine compound used includes, for example, melamine, benzoguanamine, and methyl guanamine.

In TW patent No. 293831 and WO2006004118A1, when the amino-triazine-novolac was used as curing agent for epoxy resin, it could improve the heat resistance of the copper-clad laminate made from such epoxy resin. Also, the amino-triazine-novolac resin, which is a phenolic-aldehyde resin, can react well with the epoxy resin used for the fabrication of the copper-clad laminate. However, the copper-clad laminate using amino-triazine-novolac resin as curing agent is not easily to be processed, and has unsatisfactory electrical performance.

Therefore, the various combinations of curing agents have been proposed in order to solve the problems for using a single curing agent. TW patent No. 583258 disclosed a thermosetting resin composition that included benzoxazine and an amino-triazine-novolac resin used as a composite curing agent so that the prepreg manufactured by using such a thermosetting resin composition could have low water absorption and low dielectric properties, but the prepreg manufactured had some disadvantages like low glass transition temperature, and poor heat resistance, and also the printed circuit board manufactured from such prepregs has poor chemical resistance.

On the other hand, diaminodiphenylsulfone (DDS) was conventionally used as an epoxy resin curing agent. The molecular structure of 4,4'-diaminodiphenylsulfone is shown as following:

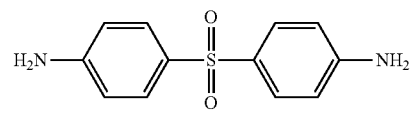

The drawback to the epoxy resin composition including diaminodiphenylsulfone is that the epoxy curing time becomes longer, and also the peeling strength between the copper foil and the circuit board laminate becomes lower. However, the diaminodiphenylsulfone was still often used in the epoxy resin composition because it can increase the glass transition temperature.

Therefore, there exists a need for providing a composite curing agent that will improve the processibility and the dielectric properties of the epoxy resin used for the fabrication of the copper-clad laminate or PCB while rendering the epoxy resin to have high glass transition temperature, high heat resistance, high peeling strength of the copper foil, and low water absorption.

SUMMARY OF THE INVENTION

Accordingly, the objective of the present invention is to provide an improved epoxy resin composition having superior heat resistance, dielectric properties, water resistance, peeling strength of the copper foil, and processability by use of a specific composite curing agent in order to solve the above-described problems of the resin composition by use of the conventional curing agents, and also to provide a prepreg and a printed circuit board prepared from such an epoxy resin composition.

To achieve the above objective, the present invention provides an epoxy resin composition comprising: (A) an epoxy resin having at least two epoxy groups in one molecule; and (B) a composite curing agent comprising 5 to 40 parts by weight of an amino-triazine-novolac resin, and 2 to 40 parts by weight of diaminodiphenylsulfone, based on 100 parts by weight of the epoxy resin.

The epoxy resin composition of the present invention can preferably include a curing accelerator additionally.

The epoxy resin composition of the present invention can optionally include an inorganic filler.

The present invention further provides a prepreg produced by impregnating a reinforcing material with the epoxy resin composition of the present invention to form an impregnated substrate, and drying the impregnated substrate to a semi-cured state.

The present invention yet further provides a PCB produced by laminating a particular number of the prepregs of the present invention to form a prepreg laminate, placing a metal foil on at least one outermost layer of the prepreg laminate and heat pressure-molding the prepreg laminate to form a metal-clad laminate, and forming a particular circuit pattern on the surface of the metal foil on the metal-clad laminate.

The objective, characteristics, aspects, and advantages of the present invention will become more evident in the following detailed description.

DETAILED DESCRIPTION OF THE PREFERRED EMBODIMENT

In the present embodiment, the epoxy resin composition for the printed circuit board comprises: (A) 100 parts by weight of an epoxy resin having at least two epoxy groups in one molecule; (B) a composite curing agent comprising 5 to 40 parts by weight of an amino-triazine-novolac resin, and 2 to 40 parts by weight of diaminodiphenylsulfone; (C) 0.01 to 1.0 parts by weight of a curing accelerator; and (D) 0 to 80 parts by weight of an inorganic filler, wherein the weight ratio of the amino-triazine-novolac resin to diaminodiphenylsulfone is in the range of from 1:0.1 to 1:3.0, and preferably 1:1. The parts by weight of components (B), (C), and (D) are based on 100 parts by weight of the epoxy resin (component (A)).

The epoxy resin (A) used in the epoxy resin composition of the present invention has at least two epoxy groups in one molecule. Examples of the epoxy resin used in the present invention include, but are not limited to, bisphenol A epoxy resin, bisphenol F epoxy resin, bisphenol S epoxy resin, phenol novolak epoxy resin such as DOPO-PNE (which is obtained by reacting 10-dihydro-9-oxa-10-phosphahenanthrene-10-oxide (DOPO) with phenol novolak epoxy resin (PNE)), cresol novolak epoxy resin, and glycidylamine epoxy resin. These epoxy resins can be used singly or in combination of two or more of them.

The composite curing agent (B) used in the epoxy resin composition of the present invention comprises an amino-triazine-novolac resin and diaminodiphenylsulfone, wherein the amino-triazine-novolac resin and diaminodiphenylsulfone can undergo a cross-linking reaction with the epoxy resin to form an interpenetrating polymeric network. The weight ratio of the amino-triazine-novolac resin to diaminodiphenylsulfone is in the range of from 1:0.1 to 1:3.0, and preferably 1:1. The amount of curing agents used usually depends on the ratio of the active hydrogen equivalent of the amine compound relative to the epoxy equivalent of the epoxy resin contained in the epoxy resin composition, and also depends on the properties of the reinforcing material used. Accordingly, 5 to 40 parts by weight of the amino-triazine-novolac resin and 2 to 40 parts by weight of diaminodiphenylsulfone, based on 100 parts by weight of the epoxy resin, are used in the present invention. The main factors that affect the properties of the interpenetrating polymeric network are the interpenetrating degree, the component ratio and the crosslinking density. Accordingly, in the present invention, the weight ratio of the epoxy resin to the amino-triazine-novolac resin is in the range of from 1:0.05 to 1:0.40, and preferably 1:0.20.

The curing accelerator (C) used in the epoxy resin composition of the present invention can be any compound that is used for accelerating the curing of an epoxy resin. Examples of the curing accelerator used in the present invention include, but are not limited to, imidazoles, more particularly alkyl substituted imidazoles such as 2-methylimidazole and 2-ethyl-4-methylimidazole, 2-phenylimidazole, 2-phenyl, 4-methylimidazole. Other suitable accelerators include tertiary amines, e.g. benzyldimethylamine and 4,4' and 3,3' diaminodiphenylsulphone. These curing accelerators can be used singly or in combination of two or more of them. One preferred curing accelerator is 2-methylimidazole. The amount of curing accelerator used is dependent on the type of epoxy resin, the type of curing agent, and the type of curing accelerator. The curing accelerator is present in the epoxy resin composition of the present invention in an amount from about 0.01 to 1.0 parts by weight, based on 100 parts by weight of the epoxy resin.

The optional inorganic filler (D) used in the epoxy resin composition of the present invention serves to impart additional flame retardancy, heat resistance and humidity resistance to the epoxy resin composition. Examples of the inorganic filler used in the present invention include, but are not limited to, fused silica, crystalline silica, silicon carbide, silicon nitride, boron nitride, calcium carbonate, barium sulfate, calcium sulfate, mica, talc, clay, alumina, magnesium oxide, zirconium oxide, aluminium hydroxide, magnesium hydroxide, calcium silicate, aluminum silicate, lithium aluminum silicate, zirconium silicate, and molybdenum disulfide. These inorganic fillers can be used singly or in combination of two or more of them. Preferred inorganic fillers include talc, and aluminium hydroxide. If the inorganic filler exists in the epoxy resin composition of the present invention, it is present in an amount between 0 to 80 parts by weight, based on 100 parts by weight of the epoxy resin.

One or more solvents can be used for preparing the epoxy resin composition varnish in the present invention in order to provide resin solubility, and control resin viscosity. Examples of the solvents used in the present invention include, but are not limited to, acetone, methylethylketone, propylene glycol methyl ether, cyclohexanone, propylene glycol methyl ether acetate. These solvents can be used singly or in combination of two or more of them. Preferred solvents include methylethylketone, and propylene glycol methyl ether. The solvent is present in the epoxy resin composition of the present invention in an amount from about 60 to 100 parts by weight, based on 100 parts by weight of the epoxy resin.

If necessary, various additives such as silane coupling agents, releasants, and flame retardants can be used in the epoxy resin composition of the present invention The epoxy resin composition of the present invention can be prepared by blending the components (A), (B), (C) and (D), and agitating the mixture uniformly, for example, in a mixer or blender.

The epoxy resin composition varnish of the present invention is prepared by dissolving or dispersing the obtained epoxy resin composition in a solvent.

A reinforcing material is impregnated with the resin varnish to form an impregnated substrate, and then the impregnated substrate is heated in a dryer at 150 to 180° C. for 2 to 10 minutes to give a prepreg in a semi-cured state (B-stage). Examples of the reinforcing material used in the present invention include, but are not limited to, glass fiber cloth, glass paper and glass mat, and also, kraft paper and linter paper.

A metal-clad laminate is prepared by laminating a particular number of the prepregs thus obtained, placing a metal foil additionally on at least one outermost layer and molding the composite under heat and pressure. As for the heat pressure-molding condition, the temperature is 160 to 190° C., the molding pressure is 10 to 30 kg/cm$^2$, and the molding time is 30 to 120 minutes. Then, a metal-clad laminate used for production of printed wiring boards is formed under such heat and pressure conditions. Examples of the metal foils used in the present invention include, but are not limited to, copper foil, aluminum foil, and stainless steel foil.

A circuit pattern formed on the surface of the metal-clad laminate is obtained by leaving circuit pattern-forming regions and removing the other regions thereof by using the subtractive process, otherwise known as the etching process. In this way, a printed wiring board carrying a circuit on the surface is obtained.

Hereinafter, the present invention will be described in more detail with reference to Examples. It should be understood that the present invention is not restricted at all by these Examples.

<Preparation of Epoxy Resin Composition Varnishes>

EXAMPLE 1

100 parts by weight of bisphenol A epoxy resin (EPON 828, manufactured by Shell Chemical Co., epoxy equivalence of 170 to 200 g/eq), 20 parts by weight of amino-triazine-novolac resin (EPICLON N-7054, manufactured by Dainippon Ink and Chemicals Inc., epoxy equivalence of 125 g/eq), 20 parts by weight of diaminodiphenylsulfone (hydroxyl group equivalence of 62 g/eq), 0.40 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

EXAMPLE 2

100 parts by weight of DOPO-PNE (KOLON 5138, manufactured by Kolon Chemical Co. epoxy equivalence of 250 to 390 g/eq), 20 parts by weight of amino-triazine-novolac resin (EPICLON N-7054, manufactured by Dainippon Ink and Chemicals Inc., epoxy equivalence of 125 g/eq), 20 parts by weight of diaminodiphenylsulfone (hydroxyl group equivalence of 62 g/eq), 0.42 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

EXAMPLE 3

100 parts by weight of DOPO-PNE (KOLON 5138, manufactured by Kolon Chemical Co. epoxy equivalence of 250 to 390 g/eq), 36 parts by weight of amino-triazine-novolac resin (EPICLON N-7054, manufactured by Dainippon Ink and Chemicals Inc., epoxy equivalence of 125 g/eq), 3 parts by weight of diaminodiphenylsulfone (hydroxyl group equivalence of 62 g/eq), 0.11 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

EXAMPLE 4

100 parts by weight of DOPO-PNE (KOLON 5138, manufactured by Kolon Chemical Co. epoxy equivalence of 250 to 390 g/eq), 10 parts by weight of amino-triazine-novolac resin (EPICLON N-7054, manufactured by Dainippon Ink and Chemicals Inc., epoxy equivalence of 125 g/eq), 30 parts by weight of diaminodiphenylsulfone (hydroxyl group equivalence of 62 g/eq), 0.57 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

EXAMPLE 5

50 parts by weight of bisphenol A epoxy resin (EPON 828, manufactured by Shell Chemical Co., epoxy equivalence of 170 to 200 g/eq), 50 parts by weight of DOPO-PNE (KOLON 5138, manufactured by Kolon Chemical Co. epoxy equivalence of 250 to 390 g/eq), 20 parts by weight of amino-triazine-novolac resin (EPICLON N-7054, manufactured by Dainippon Ink and Chemicals Inc.), 20 parts by weight of diaminodiphenylsulfone (hydroxyl group equivalence of 21 g/eq), 0.40 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

EXAMPLE 6

An epoxy resin composition varnish was prepared in substantially the same manner as in Example 1, except that talc was not used.

COMPARATIVE EXAMPLE 1

100 parts by weight of DOPO-PNE (KOLON 5138, manufactured by Kolon Chemical Co. epoxy equivalence of 250 to 390 g/eq), 1.0 parts by weight of amino-triazine-novolac resin (EPICLON N-7054, manufactured by Dainippon Ink and Chemicals Inc., epoxy equivalence of 125 g/eq), 45 parts by weight of diaminodiphenylsulfone (hydroxyl group equivalence of 62 g/eq), 0.92 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

COMPARATIVE EXAMPLE 2

100 parts by weight of DOPO-PNE (KOLON 5138, manufactured by Kolon Chemical Co. epoxy equivalence of 250 to 390 g/eq), 45 parts by weight of amino-triazine-novolac resin (EPICLON N-7054, manufactured by Dainippon Ink and Chemicals Inc., epoxy equivalence of 125 g/eq), 1.0 parts by weight of diaminodiphenylsulfone (hydroxyl group equivalence of 62 g/eq), 0.13 parts by weight of 2-methylimidazole, and 50 parts by weight of talc were mixed together by a mixer at room temperature for 60 minutes, and then the obtained mixture was dissolved in 80 parts by weight of methylethylketone, followed by stirring in a disperser at room temperature for 120 minutes to give the epoxy resin composition varnish.

<Preparation of Prepregs>

The 7628 (R/C: 43%) glass fiber cloths (product of Nitto Boseki Co., Ltd) were respectively impregnated with the resin varnish obtained in Examples 1 to 6 and Comparative Examples 1 to 2 at room temperature, and followed by heating the impregnated glass fiber cloths at approximately 180° C. for 2 to 10 minutes to remove the solvent in the resin varnish (here, the resulting epoxy resin compositions were semi-cured) to obtain the prepregs of Examples 1 to 6 and Comparative Examples 1 to 2.

<Preparation of Printed Circuit Boards>

Four prepregs (300 mm×510 mm) of Example 1 were held and laminated between two copper foils (thickness: 1 oz, product of Nikko Gould Foil Co., Ltd.), to give a laminate. The laminate was then molded under the heating/pressurization condition of the temperature of 180° C. (the programmed heating rate of 2.0° C./minutes) and the pressure of 15 kg/cm$^2$ (an initial pressure: 8 kg/cm$^2$) for 60 minutes, to give a copper-clad laminate for printed circuit board. Then, a circuit pattern was formed on the surface of the copper-clad laminate by leaving circuit pattern-forming regions and removing the other regions thereof by etching, and thereby a printed circuit board carrying a circuit on the surface was obtained.

The copper-clad laminates and the printed circuit boards for Examples 2 to 6 and Comparative Examples 1 to 2 were respectively obtained in the same way as the above-mentioned method for producing the copper-clad laminate and the printed circuit board of Example 1.

The properties of the copper-clad laminates obtained in Examples 1 to 6 and Comparative Examples 1 to 2 were respectively determined by the following evaluation tests.

[Water Absorption]

The standard pressure cooker test was done at 121° C., 100% relative humidity, and 2 atmospheric pressures for 1 hour.

[Solder Floating]

The sample was kept floating on a solder bath of 288° C. for the time indicated in Table 1 and, then blister of the sample was visually observed.

[Peeling Strength of Copper Foil]

A 1 oz of copper foil on the copper-clad laminate was peeled off for determination of its 90° peel strength (JIS-C-6481).

[Glass Transition Temperature]

The glass transition temperature (Tg) was measured as peak temperature of tan δ at 1 Hz by a dynamic mechanical analyzer manufactured by Seiko Instruments, Inc.

[Thermal Decomposition Temperature]

A resin was separated from a copper-clad laminate and analyzed in a thermogravimetric and differential thermal analyzer (TG-DTA). The programmed heating rate was 5° C./minute. The thermal decomposition temperature was a temperature at which the weight of the sample decreased by 5% from the initial weight.

[Flame Retardancy]

The flame retardancy of a copper-clad laminate was evaluated by the method specified in UL 94. The UL 94 is a vertical burn test that classifies materials as V-0, V-1 or V-2.

[Breaking Tenacity]

The laminate was set on a flat stage of the analyzer, and a vertical force was exerted on the laminate with a cross-shaped metal tool directly contacting with the surface of the laminate for 1 minute, which left a cross-shaped mark on the surface of the laminate. Breaking tenacity was evaluated by visually observing the cross-shaped mark on the surface of the laminate as follows: good: no white crease; normal: occurrence of slightly white crease; and bad: occurrence of cracking or breakage.

[Dielectric Properties]

The dielectric constant and the dissipation factor at 1 GHz were measured according to the procedures of ASTM D150-87.

The epoxy resin compositions and the test results of the test items above are summarized in Table 1.

TABLE 1

| Relative to 100 parts by weight of the epoxy resin | | Example 1 | Example 2 | Example 3 | Example 4 | Example 5 | Example 6 | Comparative Example 1 | Comparative Example 2 |
|---|---|---|---|---|---|---|---|---|---|
| Epoxy Resin Compositions | | | | | | | | | |
| Epoxy resin | bisphenol A epoxy resin | 100 | — | — | — | 50 | 100 | — | — |
| | DOPO-PNE | — | 100 | 100 | 100 | 50 | — | 100 | 100 |
| Composite curing agent | ATN resin | 20 | 20 | 36 | 10 | 20 | 20 | 1.0 | 45 |
| | DDS | 20 | 20 | 3 | 30 | 20 | 20 | 45 | 1.0 |
| Curing accelerator | 2MI | 0.40 | 0.42 | 0.11 | 0.57 | 0.40 | 0.40 | 0.92 | 0.13 |
| Inorganic filler | Talc | 50 | 50 | 50 | 50 | 50 | 0 | 50 | 50 |
| Solvent | MEK | 80 | 80 | 80 | 80 | 80 | 80 | 80 | 80 |
| Test Results | | | | | | | | | |
| | | Example | Example | Example | Example | Example | Example | Comparative | Comparative |

TABLE 1-continued

| Properties | Conditions | Unit | 1 | 2 | 3 | 4 | 5 | 6 | Example 1 | Example 2 |
|---|---|---|---|---|---|---|---|---|---|---|
| Water absorption | PCT 121° C./1 hr | % | 0.234 | 0.242 | 0.229 | 0.267 | 0.237 | 0.247 | 0.319 | 0.250 |
| Solder floating | 288° C. | min | >10 | >10 | >10 | 8.5 | >10 | >10 | 8.2 | >10 |
| Peeling strength (1 oz) | | lb/in | 8.4 | 8.3 | 8.7 | 7.5 | 8.5 | 8.4 | 7.1 | 8.5 |
| Glass transition temperature | DMA | °C. | 174.5 | 173.5 | 165.3 | 172.5 | 174.1 | 176.9 | 173.2 | 161.5 |
| Thermal decomposition temperature | TGA | °C. | 373.9 | 371.6 | 358.8 | 369.5 | 373.1 | 377.8 | 371.9 | 338.2 |
| Flame retardancy | Rating | UL94 | V-1 | V-0 | V-0 | V-0 | V-0 | V-1 | V-0 | V-0 |
| Breaking tenacity | | | Good | Good | Good | Normal | Good | Good | Bad | Good |
| Dielectric constant | Dk at 1 GHz | | 4.61 | 4.63 | 4.62 | 4.65 | 4.61 | 4.66 | 4.64 | 4.68 |
| Dissipation factor | Df at 1 GHz | | 0.021 | 0.022 | 0.021 | 0.023 | 0.021 | 0.023 | 0.021 | 0.023 |

As seen from Table 1, the copper-clad laminates obtained according to the present invention (Examples 1 to 6) have the well-balanced properties and every required performance for use as printed circuit boards. These copper-clad laminates are excellent in breaking tenacity, dielectric properties, and peeling strength of copper foil, and especially in Examples 1, 5, and 6, the copper-clad laminates have relatively high glass transition temperatures (Tg). Although no inorganic filler was used in the epoxy resin composition in the case of Example 6, the copper-clad laminate obtained according to Example 6 still has the required performance for use as printed circuit boards. As compared with Examples 1 to 6 of the present invention, the copper-clad laminate of Comparative Example 1 has lower peeling strength of copper foil and poor breaking tenacity, and the copper-clad laminate of Comparative Example 2 has lower glass transition temperature.

Thus, the copper-clad laminates or the printed circuit boards of the present invention can be used with high reliability. Accordingly, the copper-clad laminates or the printed circuit boards of the present invention prepared from the epoxy resin composition with amino-triazine-novolac resin and diaminodiphenylsulfone mixed in a certain proportion are not only excellent in breaking tenacity, dielectric properties, and peeling strength of copper foil, but also can be devoid of the disadvantages of the above-mentioned individual conventional curing agents amino-triazine-novolac resin and diaminodiphenylsulfone.

It is contemplated that various modifications may be made to the compositions, prepregs, laminates and printed circuit boards of the present invention without departing from the spirit and scope of the invention as defined in the following claims.

What is claimed is:

1. An epoxy resin composition, comprising:
   (A) an epoxy resin having at least two epoxy groups in one molecule; and
   (B) a composite curing agent comprising 5 to 40 parts by weight of an amino-triazine-novolac resin, and 2 to 40 parts by weight of diaminodiphenylsulfone, based on 100 parts by weight of the epoxy resin,
   wherein a ratio of the amino-triazine-novolac resin to diaminodiphenylsulfone is 1:1 by weight in the composite curing agent.

2. The epoxy resin composition as claimed in claim 1, wherein the amino-triazine-novolac resin is obtained from a condensation reaction of a phenolic compound, an aldehyde compound, and a guanamine compound in the presence of an acid catalyst.

3. The epoxy resin composition as claimed in claim 1, wherein a ratio of the epoxy resin to the amino-triazine-novolac resin is in the range of from 1:0.05 to 1:0.40 by weight.

4. The epoxy resin composition as claimed in claim 1, wherein the epoxy resin is selected from the group consisting of bisphenol A epoxy resin, bisphenol F epoxy resin, bisphenol S epoxy resin, phenolic novolak epoxy resin, cresol novolak epoxy resin, and glycidylamine epoxy resin.

5. The epoxy resin composition as claimed in claim 1, further comprising a curing accelerator.

6. The epoxy resin composition as claimed in claim 5, wherein the curing accelerator is present in an amount of 0.01 to 1.00 parts by weight, based on 100 parts by weight of the epoxy resin.

7. The epoxy resin composition as claimed in claim 5, wherein the curing accelerator is an imidazole.

8. The epoxy resin composition as claimed in claim 1, further comprising an inorganic filler.

9. The epoxy resin composition as claimed in claim 8, wherein the inorganic filler is present in an amount between 0 to 80 parts by weight, based on 100 parts by weight of the epoxy resin.

10. The epoxy resin composition as claimed in claim 8, wherein the inorganic filler includes talc, and aluminium hydroxide.

11. A prepreg produced by impregnating a reinforcing material with the epoxy resin composition according to claim 1 to form an impregnated substrate, and drying the impregnated substrate to a semi-cured state.

12. A printed circuit board produced by laminating a particular number of the prepregs according to claim 11 to form a prepreg laminate, placing a metal foil on at least one outermost layer of the prepreg laminate and heat pressure-molding the prepreg laminate to form a metal-clad laminate, and forming a circuit pattern on a surface of the metal foil on the metal-clad laminate.

13. An epoxy resin composition, comprising:
   100 parts by weight of an epoxy resin having at least two epoxy groups in one molecule;
   a composite curing agent consisting of 5 to 40 parts by weight of an amino-triazine-novolac resin, and 2 to 40 parts by weight of diaminodiphenylsulfone, based on 100 parts by weight of the epoxy resin;
0.01 to 1.0 parts by weight of a curing accelerator; and
an inorganic filler,
wherein a ratio of the amino-triazine-novolac resin to diaminodiphenylsulfone is 1:1 by weight in the composite curing agent.

14. An epoxy resin composition, consisting of:
an epoxy resin having at least two epoxy groups in one molecule;
a composite curing agent consisting of 5 to 40 parts by weight of an amino-triazine-novolac resin, and 2 to 40 parts by weight of diaminodiphenylsulfone, based on 100 parts by weight of the epoxy resin;
0.02 to 1.0 parts by weight of a curing accelerator; and
an inorganic filler,
wherein a ratio of the amino-triazine-novolac resin to diaminodiphenylsulfone is 1:1 by weight in the composite curing agent.

* * * * *